(12) United States Patent
Chung

(10) Patent No.: US 7,118,944 B2
(45) Date of Patent: Oct. 10, 2006

(54) METHOD FOR FABRICATING POLYCRYSTALLINE SILICON THIN FILM TRANSISTOR

(75) Inventor: Hoon-Ju Chung, Gyeonggi-do (KR)

(73) Assignee: LG.Philips LCD Co., Ltd., Seoul (KR)

(*) Notice: Subject to any disclaimer, the term of this patent is extended or adjusted under 35 U.S.C. 154(b) by 0 days.

(21) Appl. No.: 11/247,202

(22) Filed: Oct. 12, 2005

(65) Prior Publication Data

US 2006/0030089 A1 Feb. 9, 2006

Related U.S. Application Data

(62) Division of application No. 10/407,276, filed on Apr. 7, 2003, now Pat. No. 7,002,178.

(30) Foreign Application Priority Data

Apr. 15, 2002 (KR) .................. 10-2002-0020467

(51) Int. Cl.
*H01L 21/00* (2006.01)
*H01L 21/44* (2006.01)
(52) U.S. Cl. ........................ 438/149; 438/151
(58) Field of Classification Search ............ 438/149, 438/151
See application file for complete search history.

(56) References Cited

U.S. PATENT DOCUMENTS

| 6,034,748 | A  | 3/2000 | Furuta |
| 6,249,327 | B1 | 6/2001 | Murade et al. |
| 6,569,717 | B1 | 5/2003 | Jurade |
| 6,624,051 | B1 | 9/2003 | Ohtani et al. |

FOREIGN PATENT DOCUMENTS

| JP | 05-121439 | 5/1993 |
| KR | 1998-012042 | 11/1998 |

OTHER PUBLICATIONS

Hoon-Ju Chung, et al. "Novel Dual-Gate Poly-Si TFT's with Intermediate Lightly Doped Region", Asia Display/IDW '01, pp. 1737-1740.
Byung-Hyuk Min, et al. "Electrical Characteristics of New LDD Poly-Si TFT Structure Tolerant to Process Misalignment" IEEE Electron device Letters, vol. 20, No. 7, Jul. 1999.
Hoon-Ju Chung, et al. "P-5: Leakage Current Characteristics of Dual-Gate Poly-Si TFT's with Intermediate Lightly Doped Region" SID 02 Digest. pp. 217-219.
Richard S. Muller, et al. Device Electronics for Integrated Circuits second edition John Wiley and Sons, 1986, pp. 424-425.

*Primary Examiner*—David S. Blum
(74) *Attorney, Agent, or Firm*—McKenna Long & Aldridge LLP

(57) ABSTRACT

A thin film transistor device includes a substrate, a buffer layer on the substrate, an active layer on the buffer layer, the active layer is formed of polycrystalline silicon and includes first undoped areas, a second lightly doped area, and third highly doped areas, a gate insulation layer on the buffer layer, a dual-gate electrode on the gate insulation layer including first and second gate electrodes corresponding to the first areas, an interlayer insulator on the gate insulation layer covering the dual-gate electrode, source and drain contact holes exposing the third areas, a gate contact hole penetrating the interlayer insulator to expose a portion of the dual-gate electrode, source and drain electrodes on the interlayer insulator contacting the third areas through the source and drain contact holes, and a third gate electrode on the interlayer insulator contacting the exposed portion of the dual-gate electrode through the gate contact hole.

46 Claims, 15 Drawing Sheets

METHOD FOR FABRICATING POLYCRYSTALLINE SILICON THIN FILM TRANSISTOR

This application is a Divisional of prior U.S. application Ser. No. 10/407,276, filed Apr. 7, 2003 now U.S. Pat. No. 7,002,178.

The present invention claims the benefit of Korean Patent Application No. 2002-0020467 filed in Korea on Apr. 15, 2002, which is hereby incorporated by reference.

BACKGROUND OF THE INVENTION

1. Field of the Invention

The present invention relates to a thin film transistor (TFT) and a method for fabricating the same, and more particularly, to a polycrystalline silicon thin film transistor (poly-Si TFT) and a method of fabricating the same that decreases leakage current and improves electrical characteristics of the TFT.

2. Discussion of the Related Art

In general, a poly-Si TFT has high carrier mobility, decreased photo current, and relatively low-level shift voltage in comparison with an amorphous silicon thin film transistor (a-Si TFT). Accordingly, a poly-Si TFT is commonly employed as a switching element in the liquid crystal display panel to achieve high resolution or in a projection panel to achieve high light intensity. Further, a poly-Si TFT can be fabricated as both an n-channel TFT and a p-channel TFT to form a CMOS circuit.

In addition, a poly-Si TFT can be fabricated by utilizing current semiconductor fabrication processes, because the method for fabricating a poly-Si TFT is similar to the CMOS process of silicon wafer. In particular, an intrinsic amorphous silicon layer is formed on an insulating substrate by using a Plasma Chemical Vapor Deposition (PCVD) method or a Low Pressure Chemical Vapor Deposition (LPCVD) method. After the amorphous silicon layer has a thickness of about 500 angstroms (Å), it is re-crystallized into a polycrystalline silicon layer using a crystallization method.

The crystallization method is generally classified into one of an Excimer Laser Crystallization (ELC) method, a Solid Phase Crystallization (SPC) method, a Metal Induced Crystallization (MIC) method, and a Metal Induced Lateral Crystallization (MILC). In the ELC method, an insulating substrate having an amorphous silicon layer formed thereon is heated to a temperature of about 250° C. Then, an excimer laser beam is applied to the amorphous silicon layer to form a polycrystalline silicon layer. In the SPC method, the amorphous silicon layer is heat-treated at a high temperature for a long time to crystallize into a polycrystalline silicon layer.

In the MIC method, a metal layer is deposited on the amorphous silicon layer and the deposited metal is used for crystallization. Here, a large-sized glass substrate can be used as an insulating substrate. In the MILC method, a metal is first formed on the amorphous silicon layer, and then the amorphous silicon layer is crystallized. Also, in the MILC method, an oxide pattern is formed on a predetermined active portion of the amorphous silicon layer, and the amorphous silicon layer is converted into polycrystalline silicon by lateral grain growth.

Since the ELC method can be performed at a relatively low temperature on inexpensive glass substrates, the ELC method has been widely used to covert amorphous silicon into polycrystalline silicon by applying laser energy to the deposited amorphous silicon. Further, when the ELC method is used to form TFTs that are adopted as switching elements in an array substrate of a liquid crystal display, the fabricated TFTs become n-channel TFTs and manipulate liquid crystals by applying voltages to the liquid crystals.

To have a high display quality in a liquid crystal display, the TFT is required to have a sufficiently low OFF current (i.e., a current flowing when the TFT is turned OFF). However, the poly-Si TFT has high ON and OFF currents in comparison to an a-Si TFT. Since the carrier mobility of the polycrystalline silicon is large. Thus, leakage current increases in an interface between doped source and drain regions and un-doped channel region.

To solve the problems above, the polycrystalline silicon layer of the poly-Si TFT has an offset area or a lightly doped region (LDR) in the source and drain regions. The offset area is an un-doped region of the source and drain regions and the LDR is a region that impurities of low concentration are lightly doped. Additionally, the gate electrode of the poly-Si TFT has a multiple structure, e.g., a dual structure, to decrease the leakage current.

FIGS. 1A to 1E are cross-sectional views of a polycrystalline silicon thin film transistor according to the related art. In FIG. 1A, a buffer layer 12 is first formed on a substrate 10. The buffer layer 12 is a silicon insulating material, such as silicon nitride ($SiN_X$) or silicon oxide ($SiO_2$), and the buffer layer 12 functions to prevent diffusion of alkali material from the substrate 10 when heat is applied to the substrate 10. Also, amorphous silicon, such as a-Si:H, is deposited on the buffer layer 12 to form an amorphous silicon layer 14. Then, the substrate 10 having the amorphous silicon layer 14 is heated to a temperature of 400 to 500° C. to eliminate hydrogen gas ($H_2$) included in the amorphous silicon layer 14, wherein the heating process is commonly known as a dehydrogenation process. In FIG. 1B, after the dehydrogenation process, laser beams are applied to the amorphous silicon layer 14 shown in FIG. 1A, thereby converting the amorphous silicon layer 14 to a polycrystalline silicon layer 16.

In FIG. 1C, the polycrystalline silicon layer 16 (in FIG. 1B) is then patterned into an island shape to form an active layer 18. In addition, a gate insulation layer 20 is deposited on the buffer layer 12 to cover the active layer 18. The gate insulation layer 20 is an inorganic material, such as silicon nitride ($SiN_X$) or silicon oxide ($SiO_2$). Further, a conductive metallic material is deposited on the gate insulation layer 20, and then patterned to form a gate electrode 22 over the active layer 18. The deposited conductive metallic material may be aluminum (Al), chromium (Cr), molybdenum (Mo), or molybdenum tungsten (MoW). Moreover, the gate electrode 22 can have a double-layered structure of molybdenum/aluminum neodymium (Mo/AlNd). A portion of the active layer 18, which corresponds to the gate electrode 22, is a channel region when the thin film transistor is complete. Alternatively, the gate electrode 22 can be made of polycrystalline silicon. After forming the gate electrode 22, a low-density n-type dopant (hereinafter referred to as a n⁻ ion) is applied to an entire surface of the substrate 10. However, the gate electrode 22 functions as a mask, such that the active layer 18 is doped by the n⁻ ion except for the portion corresponding to the gate electrode 22.

In FIG. 1D, a photo resist pattern 23 is formed on the gate insulation layer 20 to cover the gate electrode 22. Therefore, the doped portion of the active layer 18 is considered as divided into a first area A1 and a second area A2, where the first area A1 is overlapped by the photo resist pattern 23 and the second area A2 is not overlapped by photo resist pattern 23. After forming the photo resist pattern 23, a high-density n-type dopant (hereinafter referred to as a n⁺ ion) is applied to the entire surface of the substrate 10. Then, the first area A1 of the active layer 18 becomes a lightly doped region (LDR), and the second area A2 of the active layer 18 becomes a highly doped region (HDR), thereby forming source and drain regions. Accordingly, the substrate 10 includes, on both sides of the gate electrode 22, the source and drain regions A2 where the high density n-type ions are doped and the LDRs A1 where the low density n-type ions are doped.

In FIG. 1E, the photo resist pattern 23 (in FIG. 1D) is removed, and a passivation layer 24 is formed on an entire surface of the gate insulation layer 20 to cover the gate electrode 22. The passivation layer 24 is an inorganic material, such as silicon nitride ($SiN_x$) or silicon oxide ($SiO_2$), or an organic material, such as benzocyclobutene (BCB) or an acrylic resin. Then, the passivation layer 24 and the gate insulation layer 20 are partially etched to form a source contact hole 26 and a drain contact hole 28 exposing the source and drain regions A2, respectively. Thereafter, the source and drain electrodes 30 and 32 are formed on the passivation layer 24, where the source and drain electrodes 30 and 32 contact the source and drain regions A2, respectively, through the source and drain contact holes 26 and 28. Accordingly, a poly-Si TFT is formed with the LDRs in the source and drain regions of the active layer and multiple gate electrodes (e.g., a dual gate electrode) to more decrease the leakage current. When the multiple gate electrodes are employed in the poly-Si TFT, the LDRs are enlarged and the electric field decreases in the TFT, thereby lowering the leakage current.

FIGS. 2A to 2D are cross-sectional views of another polycrystalline silicon thin film transistor having dual gate electrodes according to the related art. In FIG. 2A, a buffer layer 52 is formed on a substrate 50. The buffer layer 52 is a silicon insulating material, such as silicon nitride ($SiN_x$) or silicon oxide ($SiO_2$). Also, a polycrystalline silicon layer is formed on the buffer layer 52, and then patterned to form an island-shaped active layer 54 of polycrystalline silicon.

In FIG. 2B, a gate insulation layer 56 is formed on the buffer layer 52 to cover the active layer 54, and the gate insulation layer 56 is an inorganic material, such as silicon nitride ($SiN_x$) or silicon oxide ($SiO_2$). After forming the gate insulation layer 56, a dual-gate electrode 58 is formed on the gate insulation layer 56 over the active layer 54. The dual-gate electrode 58 includes a first gate electrode 58a and a second gate electrode 58b, wherein both the first and second gate electrodes 58a and 58b receive the same voltage. Thereafter, the n⁻ ion is doped an entire surface of the substrate 50. Thus, the active layer 54 is doped by the n⁻ ions except the portions overlapped by the first and second gate electrodes 58a and 58b where the dual-gate electrode 58 functions as a mask. Further, a portion of the active layer 54 between the first and second gate electrodes 58a and 58b becomes a first active area B1, and the outer parts of the active layer 54 which are doped by the n⁻ ions become second active areas B2.

In FIG. 2C, photo resist patterns 60a and 60b are formed on the gate insulation layer 56 while covering the first and second gate electrodes 58a and 58b. The first photo resist pattern 60a covers and surrounds the first gate electrode 58a, and the second photo resist pattern 60b covers and surrounds the second photo resist pattern 58b. Since the first and second photo resist patterns 60a and 60b are not connected to each other, the first active area B1 is divided into third active areas B3 that the first and second photo resist patterns 60a and 60b overlap and a fifth active area B5 over which the photo resist pattern 60 do not exist. Accordingly, each second active area B2 is divided into the third active area B3 over which the photo resist pattern 60 exists and a fourth active area B4 over which the photo resist pattern 60 does not exist.

After forming the photo resist patterns 60a and 60b, n⁺ ions, such as phosphorous ions, are applied to the entire surface of the substrate 50. Therefore, the fourth and fifth active areas B4 and B5 become highly doped regions (HDRs), and the third active areas B3 overlapped by the photo resist patterns 60a and 60b become lightly doped regions (LDRs), thereby forming source and drain regions. After the n⁺ ion doping, the photo resist patterns 60a and 60b are sequentially removed. Accordingly, the active layer 54 includes the LDRs around the dual-gate electrode 60, and the HDRs around the LDRs.

In FIG. 2D, a passivation layer 62 is formed on the entire surface of the gate insulation layer 56 to cover the dual-gate electrode 58. Then, the passivation layer 62 and the gate insulation layer 56 are partially etched to form a source contact hole 64 and a drain contact hole 66. The source contact hole 64 and the drain contact hole 66 expose the highly doped source and drain regions B4, respectively. Thereafter, source and drain electrodes 68 and 70 are formed on the passivation layer 62. The source and drain electrodes 68 and 70 contact the source and drain regions B4, respectively, through the source and drain contact holes 64 and 66. Accordingly, a polycrystalline silicon thin film transistor is formed having the dual-gate electrode and the LDRs in the active layer.

However, when forming the photo resist pattern for the LDRs according to the related art, the photo resist pattern may be misaligned due to fabrication errors. As a result, the LDRs disposed on both sides of the gate electrode may have different sizes. If the LDRs are disposed asymmetrically in the active layer, the poly-Si TFT may have an unstable and swaying threshold voltage.

SUMMARY OF THE INVENTION

Accordingly, the present invention is directed to a polycrystalline silicon thin film transistor and a method of fabricating the same that substantially obviates one or more problems due to limitations and disadvantages of the related art.

An object of the present invention is to provide a polycrystalline silicon thin film transistor having a multiple gate electrode and a method of fabricating the same to reduce leakage current.

Another object of the present invention is to provide a polycrystalline silicon thin film transistor having symmetrically disposed LDRs (lightly doped regions) therein and a method of fabricating the same to obtain optimized operation characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor device, includes a substrate, a buffer layer on the substrate, an island-shaped active layer on the buffer layer, the island-shaped active layer is formed of polycrystalline silicon and includes first undoped areas, a second lightly doped area, and third highly doped areas, a gate insulation layer on the buffer layer and covering the island-shaped active layer, a dual-gate electrode on the gate insulation layer and including first and second gate electrodes corresponding to the first undoped areas, an interlayer insulator formed on the gate insulation layer and covering the dual-gate electrode, source and drain contact holes penetrating the interlayer insulator and the gate insulation layer to expose the third highly doped areas, a gate contact hole penetrating the interlayer insulator to expose a portion of the dual-gate electrode, source and drain electrodes formed on the interlayer insulator and contacting the third highly doped areas through the source and drain contact holes, and a third gate electrode formed on the interlayer insulator and contacting the exposed portion of the dual-gate electrode through the gate contact hole.

In another aspect, a method for fabricating a thin film transistor device includes the steps of: forming a buffer layer on a substrate, forming an island-shaped polycrystalline silicon active layer on the buffer layer to include first, second, and third areas, forming a gate insulation layer on the buffer layer to cover the island-shaped polycrystalline silicon active layer, forming a dual-gate electrode on the gate insulation layer to correspond to the first area of the island-shaped polycrystalline silicon active layer, the dual-gate electrode includes a first gate electrode and a second gate electrode, forming a photo resist pattern on a portion of the gate insulation layer between the first and second gate electrodes, to partially overlap portions of the first and second gate electrodes, removing the photo resist pattern from the gate insulation layer and the first and second gate electrodes, forming an interlayer insulator on the gate insulation layer to cover the first and second gate electrodes, forming a gate contact hole to expose a portion of the dual-gate electrode by partially etching the interlayer insulator, forming source and drain contact holes to penetrate both the interlayer insulator and the gate insulation layer to expose the third areas of the island-shaped polycrystalline silicon active layer, and forming source and drain electrodes and a third gate electrode on the interlayer insulator, wherein the source and drain electrodes contact the third areas of the polycrystalline silicon active layer through the source and drain contact holes, and the third gate electrode contacts the exposed portion of the dual-gate electrode through the gate contact hole.

In another aspect, a method for fabricating a thin film transistor device includes the steps of: forming a buffer layer on a substrate, forming an island-shaped polycrystalline silicon active layer on the buffer layer to include first, second, and third areas, forming a gate insulation layer on the buffer layer to cover the island-shaped polycrystalline silicon active layer, forming a dual-gate electrode on the gate insulation layer to correspond with the first area, the dual-gate electrode includes a first gate electrode and a second gate electrode, forming a photo resist pattern on a portion of the gate insulation layer between the first and second gate electrodes to fully cover the first and second gate electrodes, fill a space between the first and second gate electrodes, and partially overlap the third areas, removing the photo resist pattern from the gate insulation layer and the first and second gate electrodes, forming an interlayer insulator on the gate insulation layer to cover the first and second gate electrodes, forming gate contact holes to expose a portion of the dual-gate electrode by partially etching the interlayer insulator, forming source and drain contact holes to penetrate both the interlayer insulator and the gate insulation layer to expose the third areas, and forming source and drain electrodes and a third gate electrode on the interlayer insulator, wherein the source and drain electrodes contact the third areas of the polycrystalline silicon active layer through the source and drain contact holes, and the third gate electrode contacts the exposed portion of the dual-gate electrode through the gate contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1A:
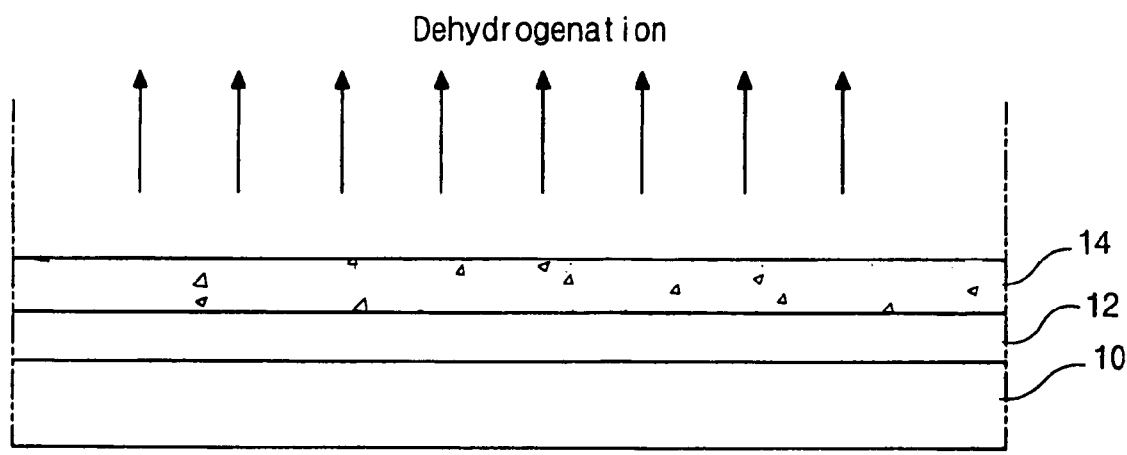
FIGS. 1A to 1E are cross-sectional views of a polycrystalline silicon thin film transistor according to the related art.
Figure 1B:
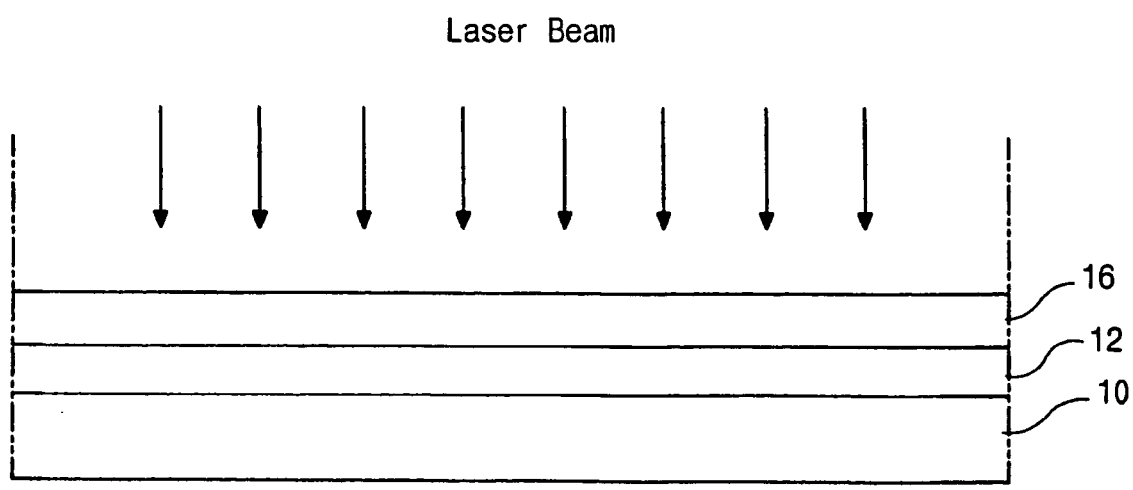
Figure 1C:
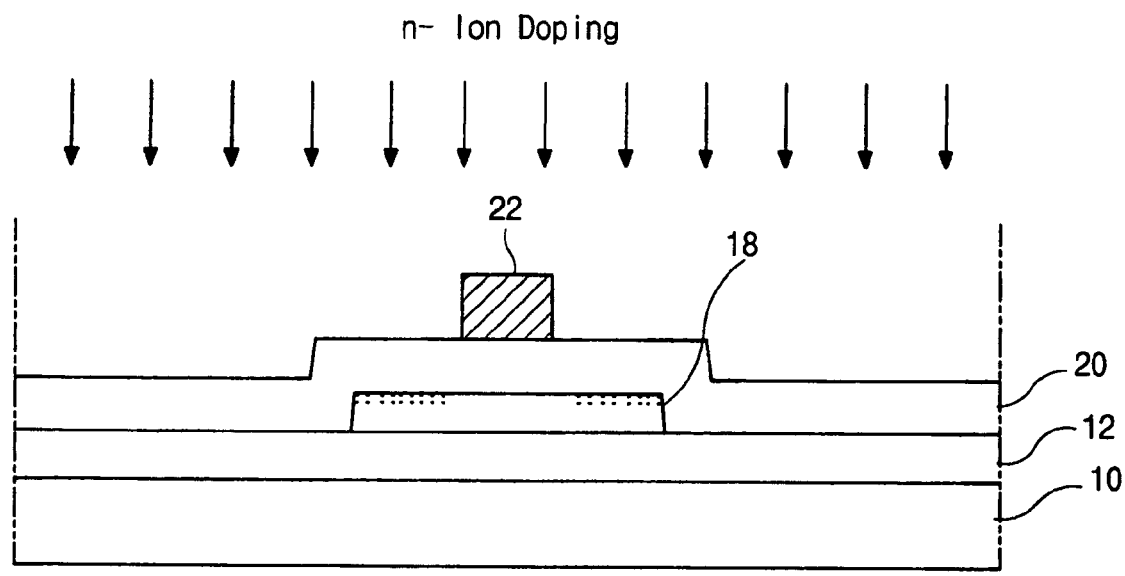
Figure 1D:
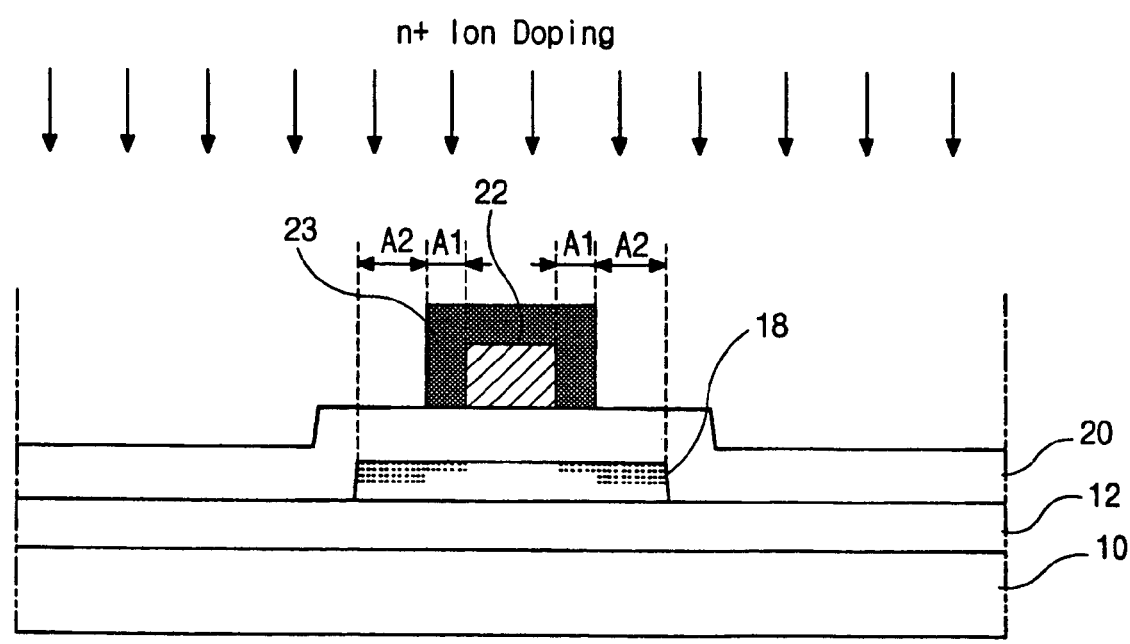
Figure 1E:
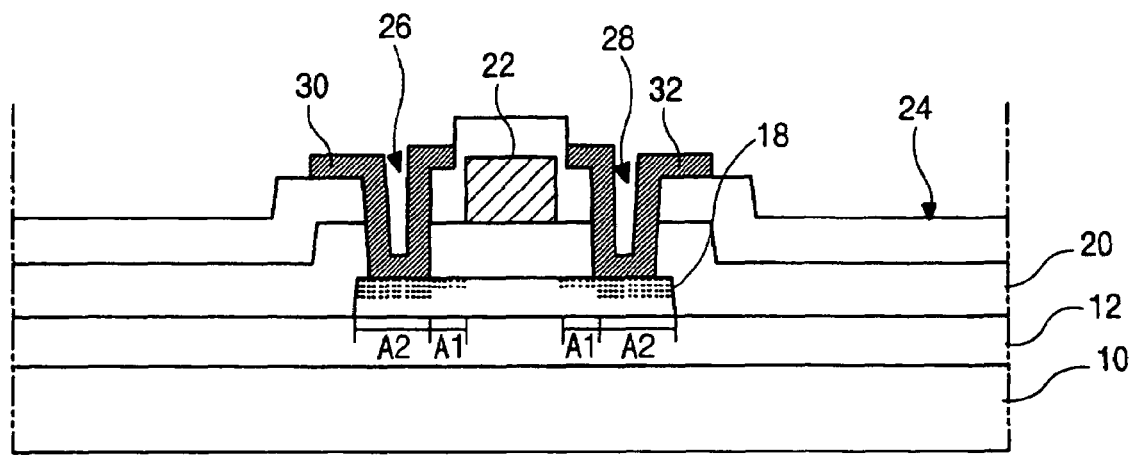
Figure 2A:
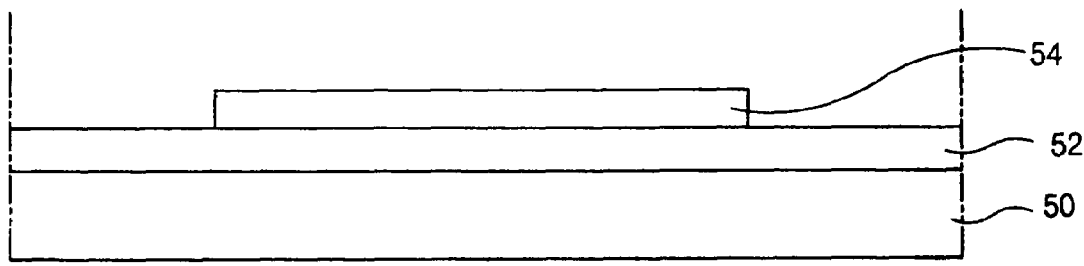
FIGS. 2A to 2D are cross-sectional views of another polycrystalline silicon thin film transistor having dual gate electrodes according to the related art.
Figure 2B:
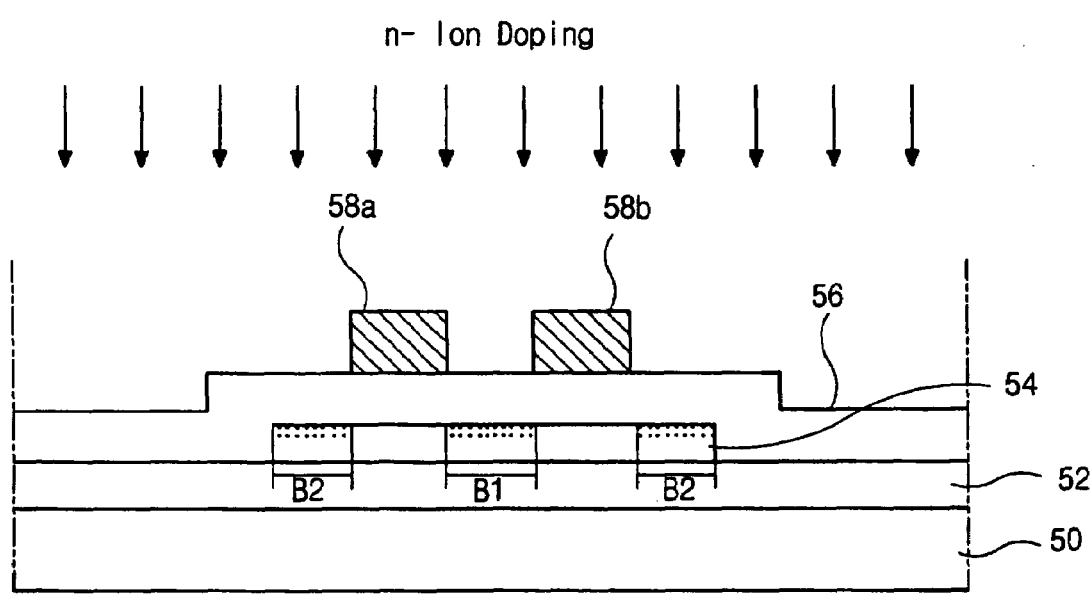
Figure 2C:
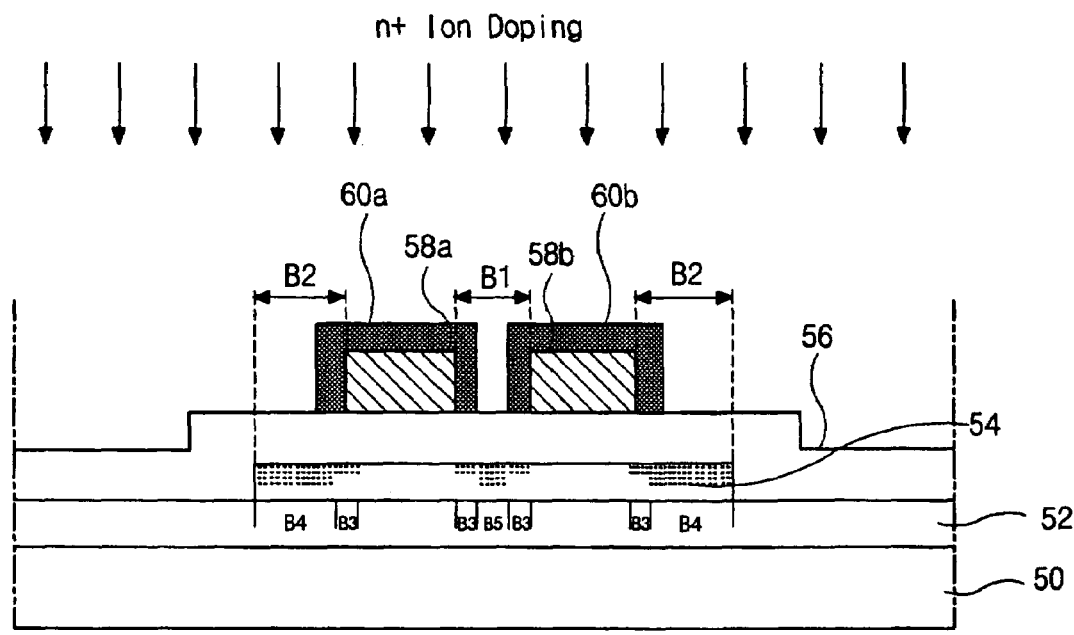
Figure 2D:
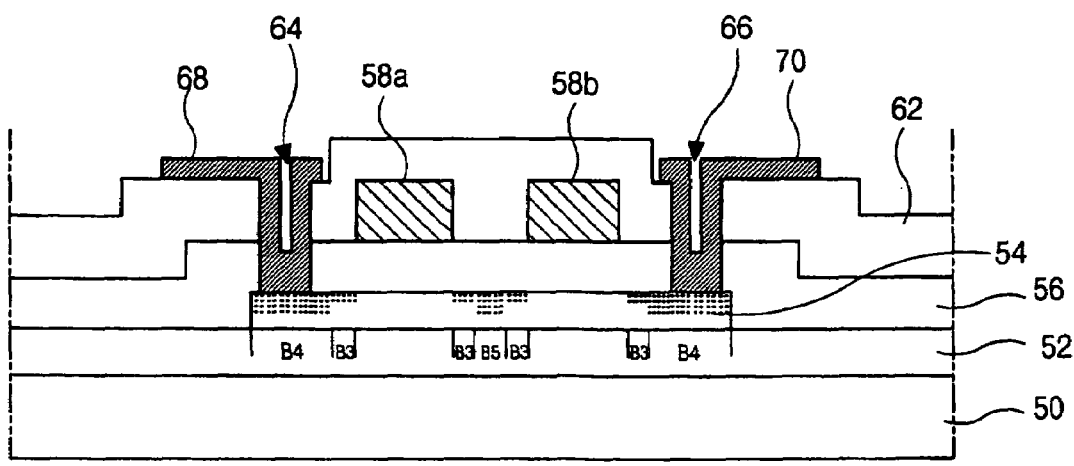
Figure 3A:
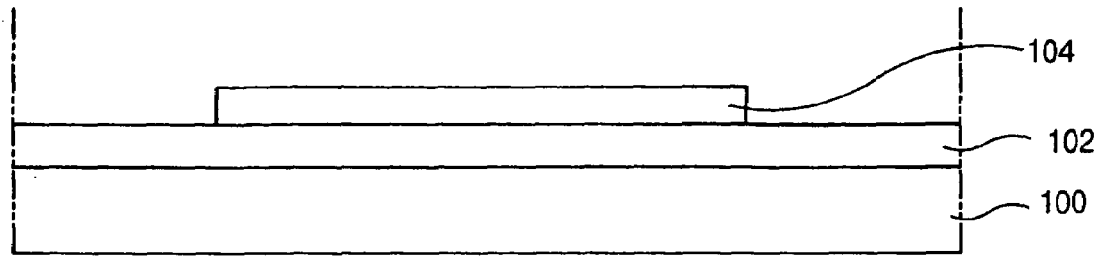
FIGS. 3A to 3D are cross-sectional views of an exemplary polycrystalline silicon thin film transistor according to the present invention.

FIGS. 3A to 3D are cross-sectional views of an exemplary polycrystalline silicon thin film transistor according to the present invention. In FIG. 3A, a buffer layer 102 may be formed on a substrate 100. The buffer layer 102 may be a silicon insulating material, such as silicon nitride ($SiN_x$) or silicon oxide ($SiO_2$). Also, a polycrystalline silicon layer may be formed on the buffer layer 102, and may be subsequently patterned to form an island-shaped polycrystalline silicon active layer 104. For example, the polycrystalline silicon active layer 104 may be formed by applying a dehydrogenation method on an amorphous silicon layer and then converting the amorphous silicon layer into a polycrystalline silicon layer by a laser crystallization method. Further, a buffer layer 102 may function to prevent diffusion of alkali materials from the substrate 100 into the polycrystalline silicon active layer 104 when heat is applied to the substrate 100.

Figure 3B:
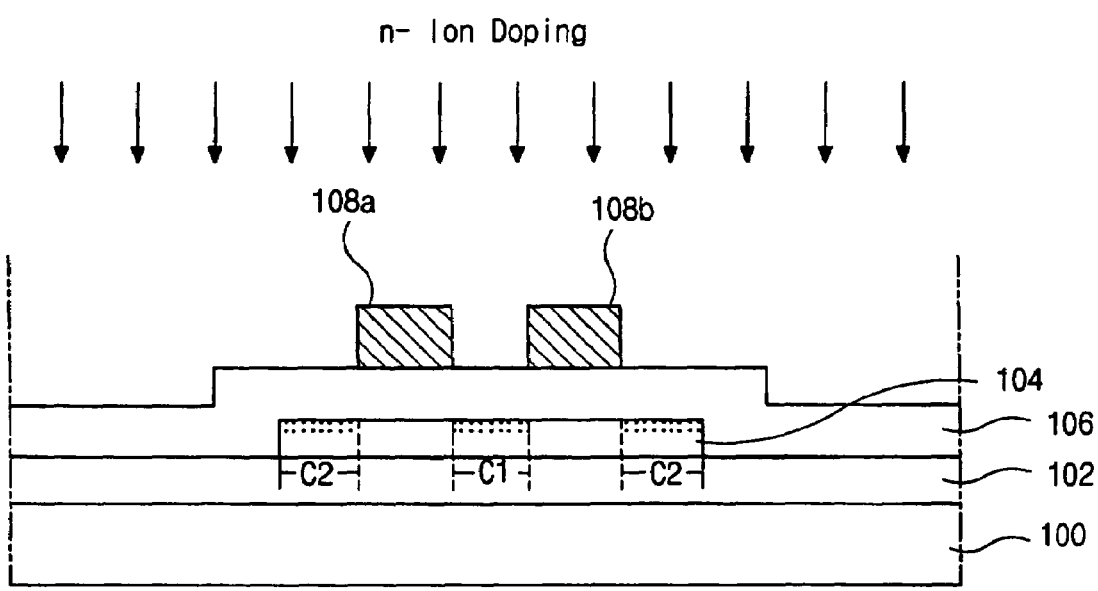

In FIG. 3B, a gate insulation layer 106 may be formed over an entire surface of the buffer layer 102 to cover the active layer 104. The gate insulation layer 106 may be an inorganic material, such as silicon nitride ($SiN_x$) or silicon oxide ($SiO_2$). In addition, a dual-gate electrode having first and second gate electrodes 108a and 108b may be formed on the gate insulation layer 106 above portions of the active layer 104. A distance between the first and second gate electrodes 108a and 108b may be within a range from about 0.5 to 5 micrometers. Further, both first and second gate electrodes 108a and 108b may be designed to receive the same voltage from a gate line upon the completion of the TFT. Moreover, an $n^-$ ion doping may be performed on the substrate 100, such that a low-density n-type dopant (e.g., phosphorous ions) may be introduced into exposed portions of the active layer 104 which are not overlapped by the first and second gate electrodes 108a and 108b. For example, the dual-gate electrode 108 may function as a mask, such that the active layer 104 may be doped by the $n^-$ ions except the portions overlapped by the first and second gate electrodes 108a and 108b. Accordingly, a portion of the active layer 104, which is disposed between the first and second gate electrodes 108a and 108b and doped by the $n^-$ ions, may become a first active area C1, and the other portions of the active layer 104, which are also doped by the $n^-$ ions, may become second active areas C2.

Figure 3C:
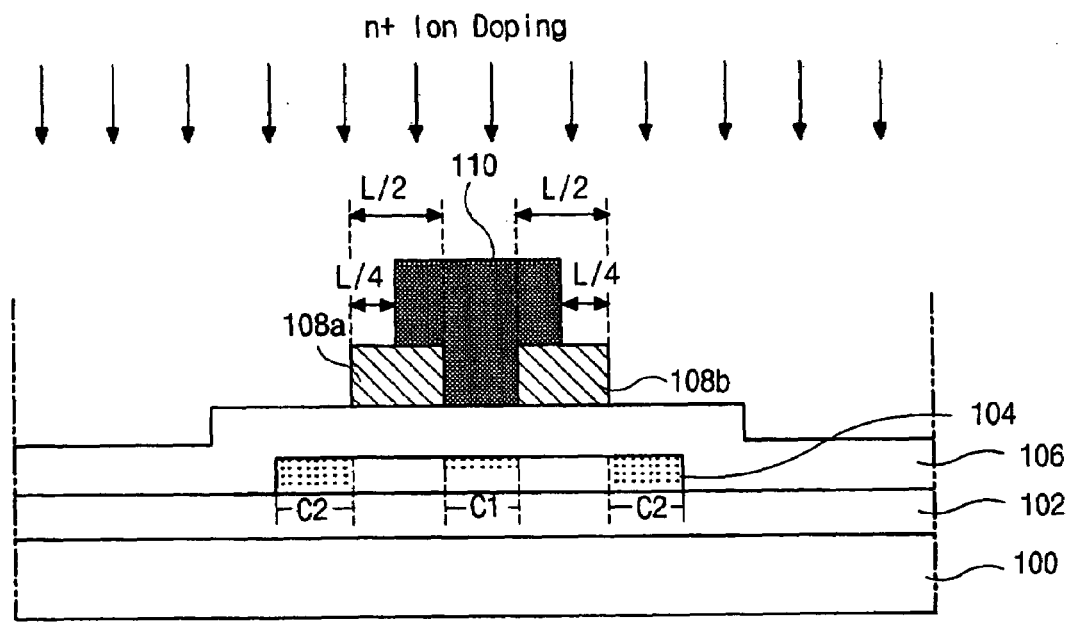

In FIG. 3C, a photo resist pattern 110 may be formed directly above the first active area C1 of the active layer 104. More specifically, the photo resist pattern 110 may be formed on a portion of the gate insulation layer 106 between the first and second gate electrodes 108a and 108b and on portions of the first and second gate electrodes 108a and 108b. In addition, the photo resist pattern 110 may fill a space between the first and second gate electrodes 108a and 108b and may not cover entire surfaces of the first and second gate electrodes 108a and 108b.

Further, an $n^+$ ion doping may be performed on the substrate 100, such that a high-density n-type dopant (e.g., high-density phosphorous ions) may be introduced into exposed portions of the active layer 104. Accordingly, the first active area C1 may remain as a lightly doped region (LDR), and the second active areas C2 may be converted into highly doped regions (HDRs), thereby forming source and drain regions in the substrate 100. Thus, the active layer 104 may include the LDR in between the first and second gate electrodes 108a and 108b, and the HDRs on both outer sides of the dual-gate electrode 108.

Moreover, the portions of the active layer 104 corresponding to the first and second gate electrodes 108a and 108b may be an active channel having a channel length L. In addition, the active channel corresponding to each gate electrode 108a or 108b may have a channel length L/2. Accordingly, if the photo resist pattern 110 overlaps a half of each gate electrode 108a or 108b, the photo resist pattern 110 may have a process margin of a one-quarter channel length L/4. Thus, even when errors occur during fabrication processing, such as a misalignment of the photo resist pattern 110, the active area C1 may be shielded by the photo resist pattern 110 to avoid formation of any partial or uneven highly doped regions. Furthermore, since the active area C1 may be isolated from the source and drain regions C2, the operating characteristics of the TFT are improved and optimum operation of the TFT is obtained.

Figure 3D:
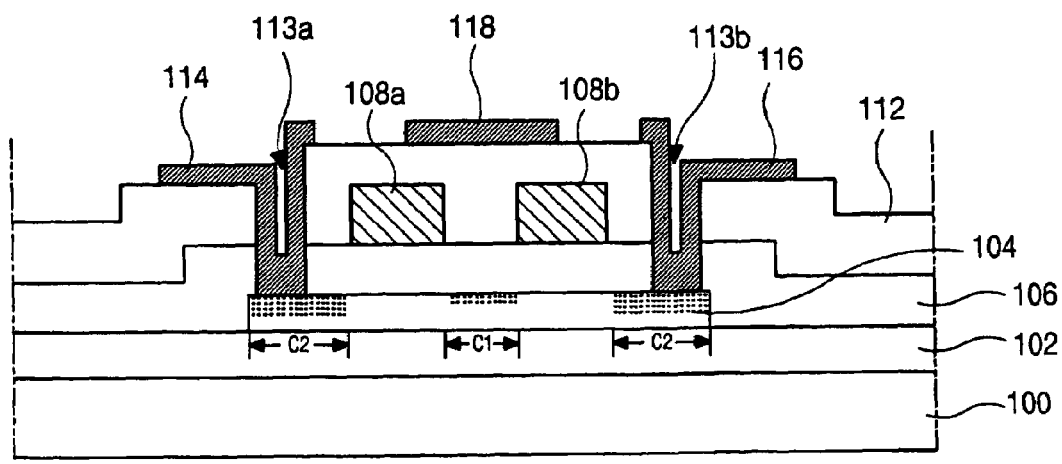

In FIG. 3D, the photo resist pattern 110 (in FIG. 3C) may be removed, and an interlayer insulator 112 may be formed on an entire surface of the gate insulation layer 106 to cover the dual-gate electrode 108. Then, the interlayer insulator 112 and the gate insulation layer 106 may be partially etched to form both a source contact hole 113a and a drain contact hole 113b. Also, a gate contact hole 125 (in FIG. 4) may be simultaneously formed when forming the source and drain contact holes 113a and 113b. The source contact hole 113a and the drain contact hole 113b may expose portions the source and drain regions C2, respectively, and the gate contact hole may expose portions of the first and second gate electrodes 108a and 108b.

In addition, the source and drain electrodes 114 and 116 may be formed on the interlayer insulator 112. The source and drain electrodes 114 and 116 may contact the source and drain regions C2, respectively, through the source and drain contact holes 113a and 113b. Moreover, when forming the source and drain electrodes 114 and 116, a third gate electrode 118 may also be formed between the source and drain electrodes 114 and 116 on the interlayer insulator 112. Using the same material as the source and drain electrodes 114 and 116, the third gate electrode 118 may be additionally formed over the active layer 104. In particular, the third gate electrode 118 may be disposed directly above the first active area C1 and over the first and second gate electrodes 108a and 108b. Accordingly, upon the completion of the TFT, when third gate electrode 118 may be turned ON, the third gate electrode 118 minimizes the resistance of the first active area C1, thereby improving ON-current of the TFT.

Figure 4:
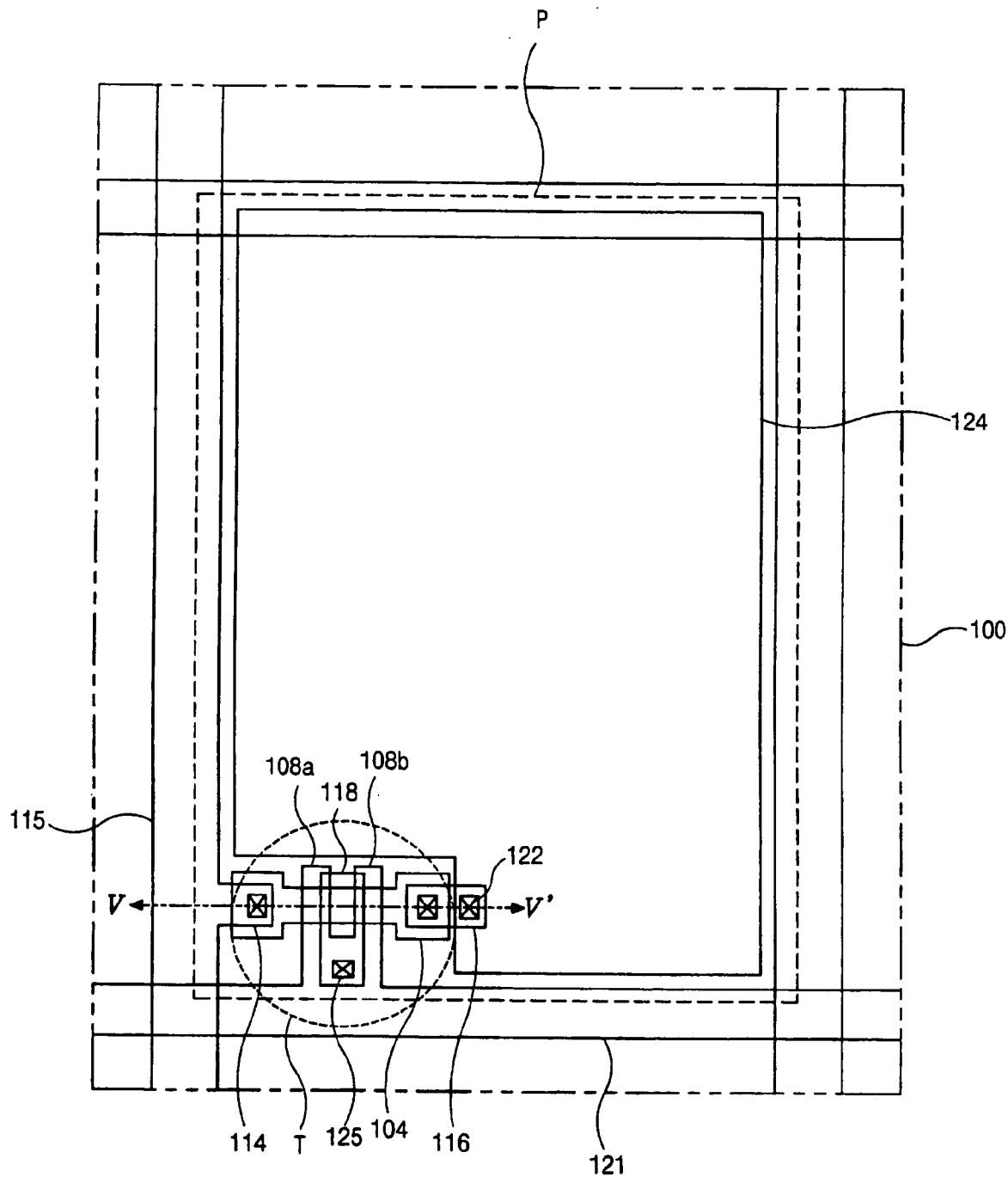
FIG. 4 is a plan view of a pixel of an array substrate having an exemplary polycrystalline silicon thin film transistor according to the present invention.
Figure 5:
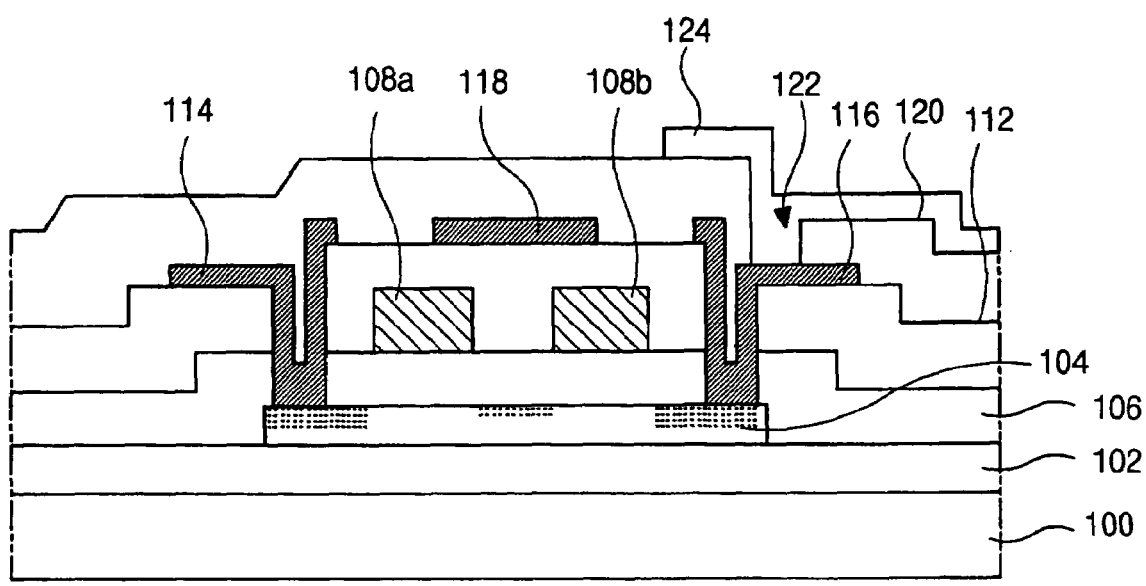
FIG. 5 is a cross-sectional view taken V–V' of FIG. 4.

FIG. 4 is a plan view of a pixel of an array substrate having an exemplary polycrystalline silicon thin film transistor according to the present invention, and FIG. 5 is a cross-sectional view taken V–V' of FIG. 4. In FIG. 4, a gate line 121 may be disposed along a transverse direction and a data line 115 may be disposed along a longitudinal direction. The data line 115 may perpendicularly cross the gate line 121, thereby defining a pixel region P. A polycrystalline silicon thin film transistor T may be disposed at the intersection of the gate and data lines 121 and 115. In the pixel region P, a pixel electrode 124 may be formed contacting the poly-Si TFT T through a contact hole 122.

In addition, the poly-Si TFT T may include first and second gate electrodes 108a and 108b extending from the gate line 121, and a source electrode 114 extending from the data line 115. The first and second gate electrodes 108a and 108b may form a U-shape, such that a first branch forms the first gate electrode 108a and a second branch forms the second gate electrode 108b. Moreover, the poly-Si TFT T may include a third gate electrode 118 contacting the gate line 121. Accordingly, the first, second and third gate electrodes 108a, 108b and 118 may receive the same gate signal from the gate line 121 through a gate contact hole 125.

In FIG. 5, a passivation layer 120 may be formed over an entire surface of the substrate 100. Thereafter, the passivation layer 120 may be partially etched to form the contact hole 122 that exposes a portion of the drain electrode 116. Then, a transparent conductive material may be formed on the passivation layer 120, and patterned to form the pixel electrode 124 in the pixel region P (in FIG. 4). The pixel electrode 124 may contact the drain electrode 116 through the contact hole 122, such that the pixel electrode 124 electrically communicates with the poly-Si TFT T.

Figure 6:
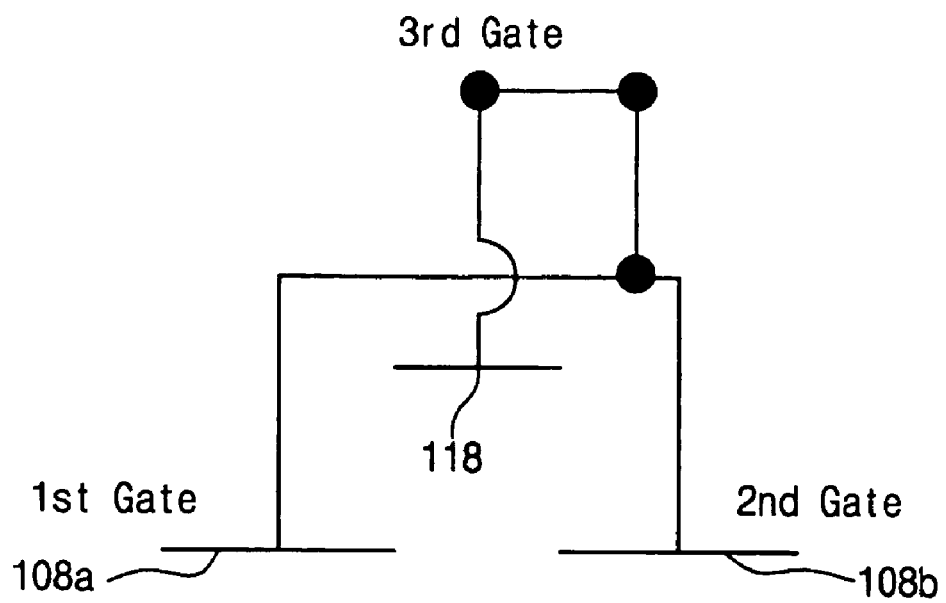
FIGS. 6 and 7 are circuit diagrams of exemplary polycrystalline silicon thin film transistors according to the present invention.
Figure 7:
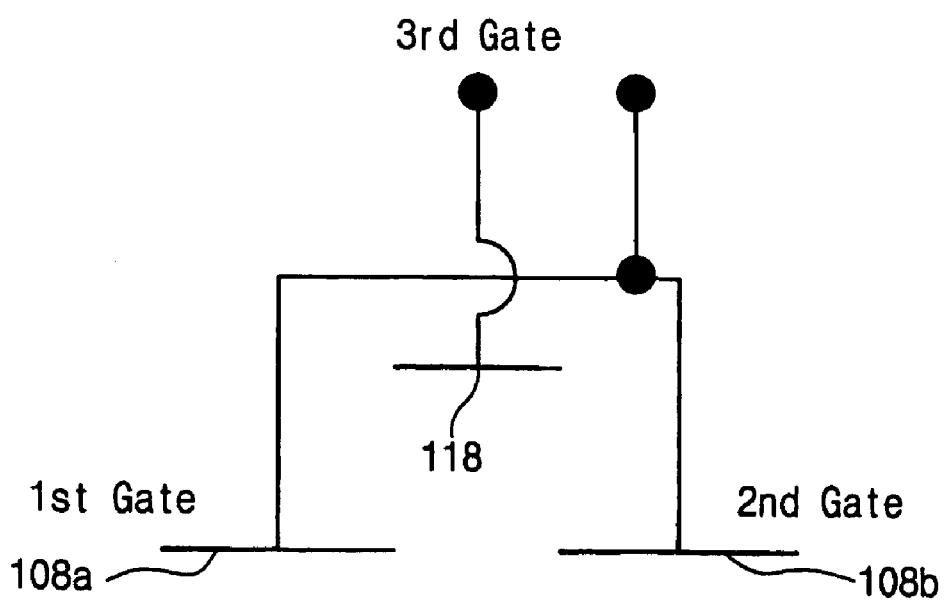

FIGS. 6 and 7 are circuit diagrams of exemplary polycrystalline silicon thin film transistors according to the present invention. In FIG. 6, a poly-Si TFT may have first, second, and third gate electrodes 108a, 108b, and 118 electrically connected to one another, such that the same signal voltage is simultaneously applied to the first, second, and third gate electrodes 108a, 108b and 118. In FIG. 7, the poly-Si TFT may alternatively have the third gate electrode 118 independently formed to separately receive signal voltages from a gate line. The same or different signal voltages may be applied to the first and second gate electrodes 108a and 108b.

Figure 8A:
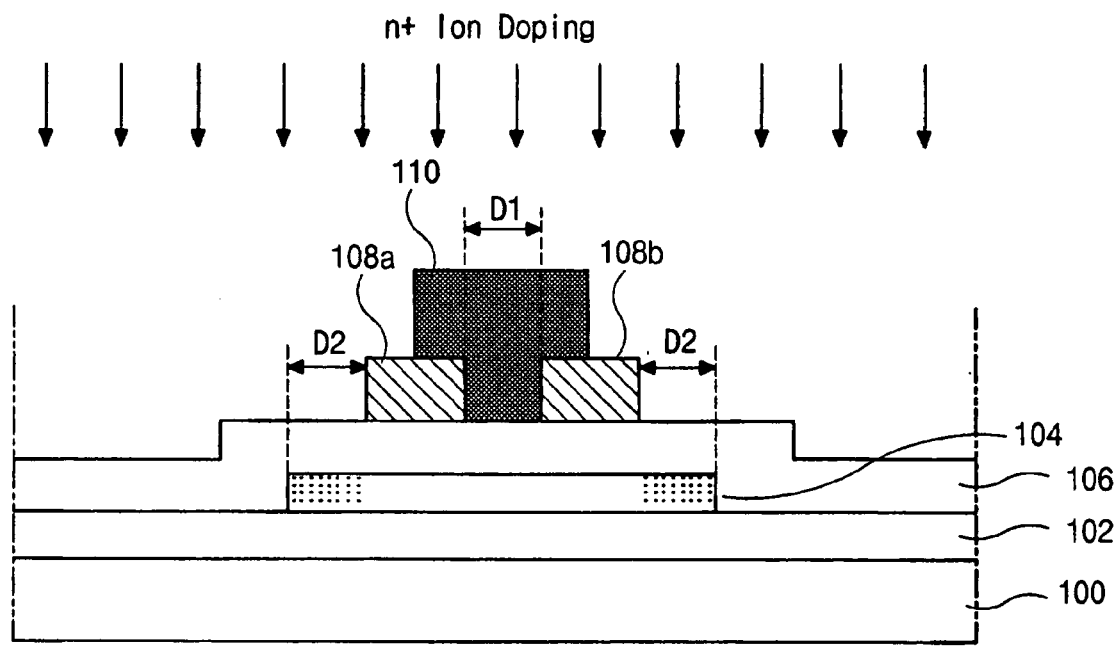
FIGS. 8A and 8B are cross-sectional views of another exemplary polycrystalline silicon thin film according to the present invention.
Figure 8B:
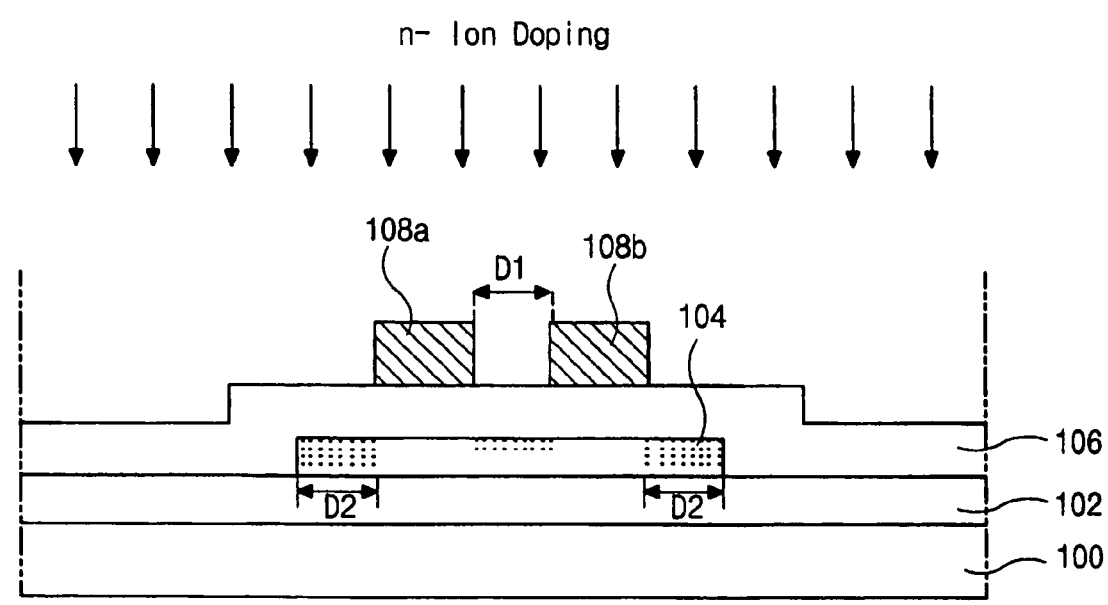

FIGS. 8A and 8B are cross-sectional views of another exemplary polycrystalline silicon thin film according to the present invention. In FIG. 8A, a buffer layer 102 may be formed on a substrate 100, and an island-shaped active layer 104 may be formed on the buffer layer 102. A gate insulation layer 106 may also be formed on the buffer layer 102 covering the active layer 104. Further, first and second gate electrodes 108a and 108b may be formed on the gate insulation layer 106, directly above portions of the active layer 104, and a photo resist pattern 110 may be formed on a portion of the gate insulation layer 106 between the first and second gate electrodes 108a and 108b. Moreover, the photo resist pattern 110 may overlap portions of the first and second gate electrodes 108a and 108b. Thereafter, $n^+$ ion doping may be performed on the substrate 100, such that portions of the active layer 104, which are not shielded by the first and second gate electrodes 108a and 108b and the photo resist pattern 110, are doped by the $n^+$ ions. Accordingly, a first active area D1 between the first and second gate electrodes 108a and 108b may remain as an un-doped region, and second regions D2 along outer portions of the active layer 104 may become highly doped regions (HDRs).

In FIG. 8B, the photo resist pattern 110 (in FIG. 8A) may be removed, and then n ions may be introduced into an entire surface of the substrate 100. Accordingly, the first active area D1 of the active layer 104 may become a lightly doped region (LDR), and the second active areas D2 may remain as the highly doped regions (HDRs). Subsequently, the substrate 100 may undergo processing shown in FIG. 3D, for example. Since the high-density ion doping process is performed before the low-density ion doping process, the source and drain regions (i.e., the second active areas D2) may be first formed, and then the lightly doped first active area D1 may be formed between the first and second gate electrodes 108a and 108b.

Figure 9A:
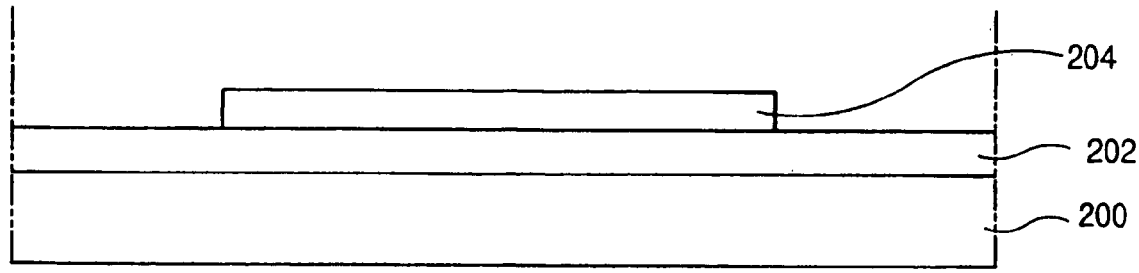
FIGS. 9A to 9D are cross-sectional views of another exemplary polycrystalline silicon thin film according to the present invention.

FIGS. 9A to 9D are cross-sectional views of another exemplary polycrystalline silicon thin film according to the present invention. In FIG. 9A, a buffer layer 202 may be formed on a substrate 200. The buffer layer 202 may include a silicon insulating material, such as silicon nitride ($SiN_x$) or silicon oxide ($SiO_2$). Then, a polycrystalline silicon layer may be formed on the buffer layer 202, and patterned to form an island-shaped polycrystalline silicon active layer 204. For example, the polycrystalline silicon active layer 204 may be formed by applying a dehydrogenation method on an amorphous silicon layer and then converting the amorphous silicon layer into a polycrystalline silicon layer by a laser crystallization method. In addition, the buffer layer 202 may function to prevent diffusion of alkali materials from the substrate 200 into the polycrystalline silicon active layer 204 when heat is applied to the substrate 200.

Figure 9B:
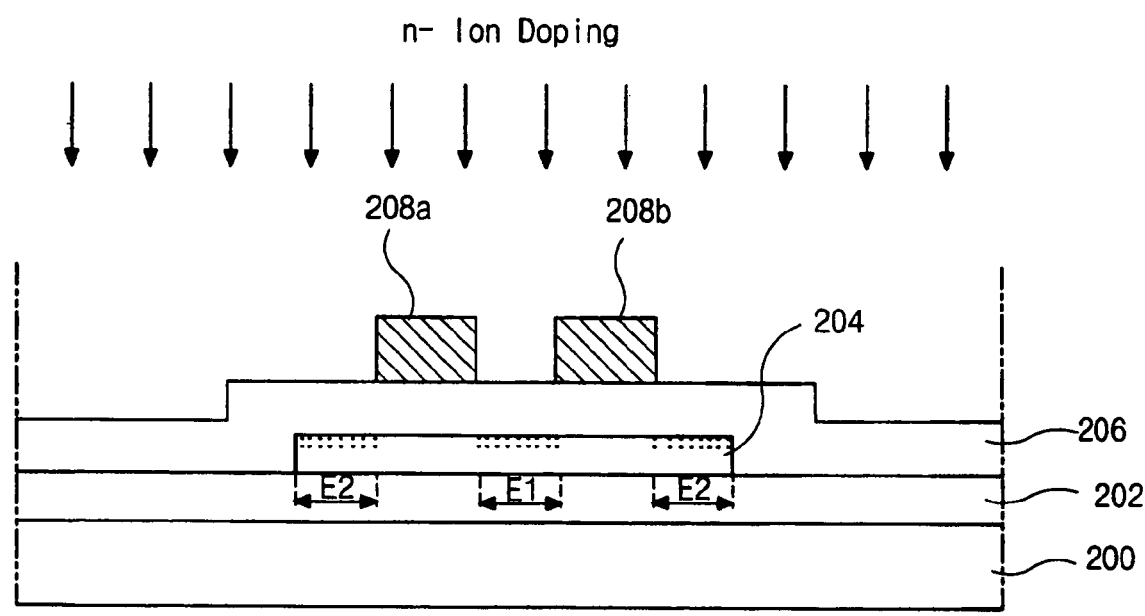

In FIG. 9B, a gate insulation layer 206 may be formed over an entire surface of the buffer layer 202 to cover the active layer 204. The gate insulation layer 206 may be an inorganic material, such as silicon nitride ($SiN_x$) or silicon oxide ($SiO_2$). Then, first and second gate electrodes 208a and 208b may be formed on the gate insulation layer 206 directly above the active layer 204. A distance between the first and second gate electrodes 208a and 208b may be within a range from about 0.5 to 5 micrometers. Further, the first and second gate electrode 208a and 208b may receive the same voltage from a gate line. In addition, an $n^-$ ion doping may be performed on an entire surface of the substrate 200, such that the low-density n-type ions, (e.g., phosphorous ions) may be introduced into exposed portions of the active layer 204 that are not overlapped by the first and second gate electrodes 208a and 208b. In particular, since the first and second gate electrodes 208a and 208b may function as a mask, the active layer 204 may be doped by the low-density n-type ions except where overlapped by the first and second gate electrodes 208a and 208b. Further, a portion of the active layer 204, which is disposed between the first and second gate electrodes 208a and 208b and doped by the $n^-$ ions, may become a first active area E1, and outer portions of the active layer 204, which are also doped by the $n^-$ ions, become second active areas E2.

Figure 9C:
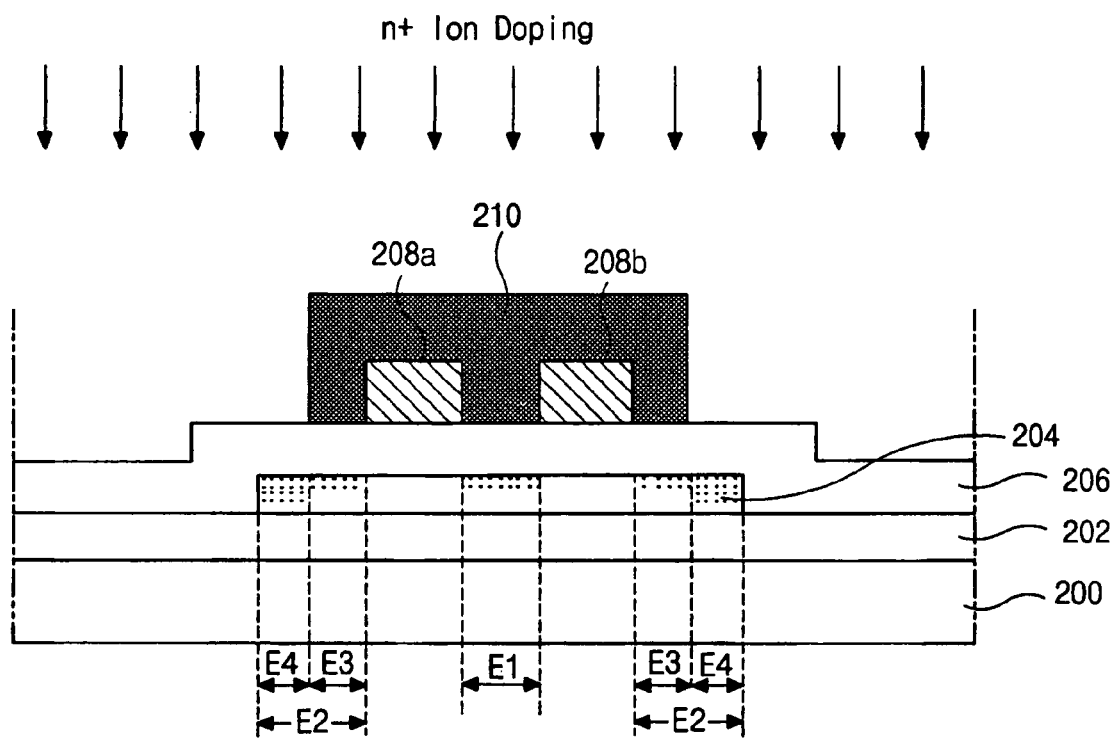

In FIG. 9C, a photo resist pattern 210 may be formed on the gate insulation layer 206 directly above the active layer 204. In particular, the photo resist pattern 210 may fully cover the first and second gate electrodes 208a and 208b, such that the photo resist pattern 210 may be formed directly above the entire first active area E1 and portions of the second active areas E2. In addition, the photo resist pattern 210 may fill a space between the first and second gate electrodes 208a and 208b, and may be formed on lateral portions of the gate insulation layer adjacent to the first and second gate electrodes 208a and 208b. After forming the photo resist pattern 210, $n^+$ ions (i.e., a high-density n-type impurities) may be introduced into the entire surface of the substrate 200. Accordingly, the second active areas E2 may be divided into third and fourth active areas E3 and E4. The third active area E3 may be overlapped by the photo resist pattern 210, wherein the $n^+$ ions are not introduced. The fourth area E4 may be overlapped by the photo resist pattern 210, wherein the $n^+$ ions are introduced. For instance, the first and third active areas E1 and E3 that are shielded by the photo resist pattern 210 may become the lightly doped regions (LDRs), and the fourth active areas E4 that are not shielded by the photo resist pattern 210 may become the highly doped regions (HDRs), thereby forming source and drain regions. Thus, the active layer 204 may include the LDRs between the first and second gate electrodes 208a and 208b and around the dual-gate electrode 208, and may further include the HDRs around the outer parts of the LDRs.

Figure 9D:
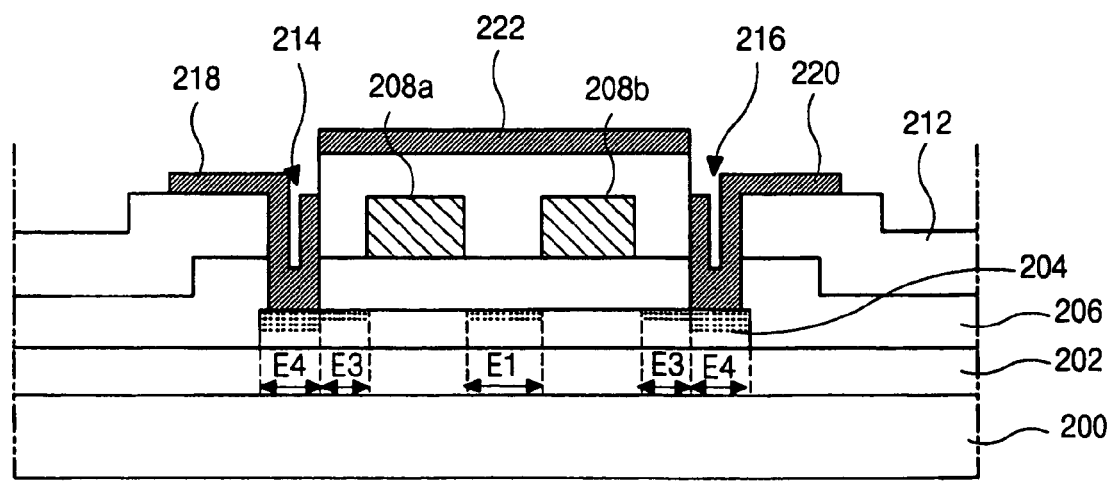

In FIG. 9D, the photo resist pattern 210 (in FIG. 9C) may be removed, and an interlayer insulator 212 may be formed on the entire surface of the gate insulation layer 206 to cover the dual-gate electrode 208. Then, the interlayer insulator 212 and the gate insulation layer 206 may be partially etched to form both a source contact hole 214 and a drain contact hole 216. In addition, a gate contact hole (125 in FIG. 4) that penetrates the interlayer insulator 212 to the dual-gate electrode 208 may be simultaneously formed when forming the source and drain contact holes 214 and 216. The source contact hole 214 and the drain contact hole 216 may expose the highly doped source and drain regions E4, and the gate contact hole (125 in FIG. 4) may expose portions of the first and second gate electrodes 208a and 208b.

In addition, the source and drain electrodes 218 and 220 may be formed on the interlayer insulator 212. The source and drain electrodes 218 and 220 may contact the source and drain regions E4 through the source and drain contact holes 214 and 216. Moreover, when forming the source and drain electrodes 218 and 220, a third gate electrode 222 may also be formed between the source and drain electrodes 218 and 220 on the interlayer insulator 212. Using the same material as the source and drain electrodes 218 and 220, the third gate electrode 222 may be additionally formed over the active layer 204. In particular, the third gate electrode 222 may be disposed directly above the first and third active areas E1 and E3 and over the dual-gate electrode 208. Accordingly, when third gate electrode 222 is turned ON, the third gate electrode 222 would minimize resistance of the first and third active areas E1 and E3, thereby improving ON-current of the poly-Si TFT.

Figure 10:
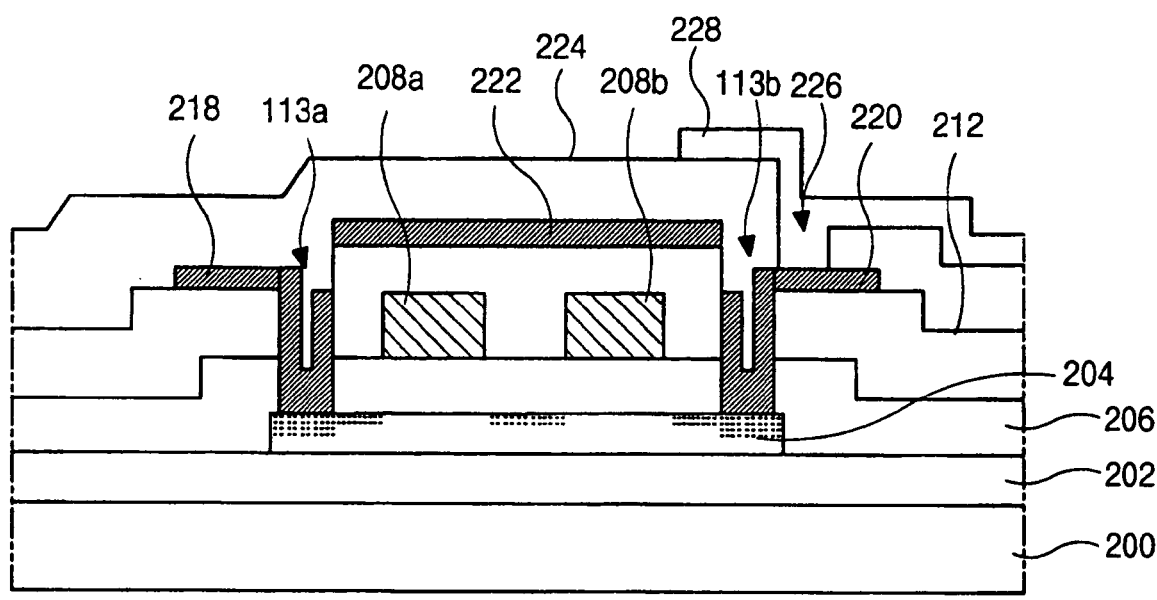
FIG. 10 is a cross-sectional view of an array substrate implementing the exemplary polycrystalline silicon thin film transistor of FIGS. 9A–9D.

FIG. 10 is a cross-sectional view of an array substrate implementing the exemplary polycrystalline silicon thin film transistor of FIGS. 9A–9D. In FIG. 10, a passivation layer 224 may be formed over the substrate 200 to cover and protect the poly-Si TFT. In addition, the passivation layer 224 may be partially etched to form a contact hole 226 that exposes a portion of the drain electrode 220. Next, a transparent conductive material may be deposited on the passivation layer 224, and then patterned to form a pixel electrode 228. The pixel electrode 228 may contact the drain electrode 220 through the contact hole 226 that penetrates the passivation layer 224.

Figure 11A:
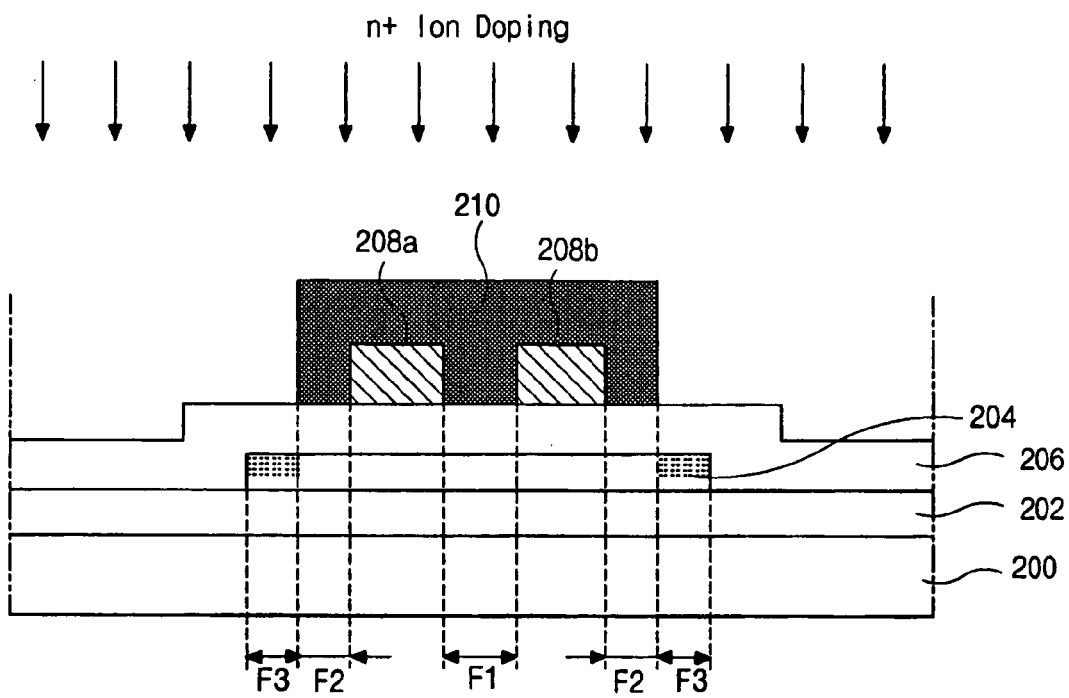
FIGS. 11A and 11B are cross-sectional views of another exemplary polycrystalline silicon thin film according to the present invention.
Figure 11B:
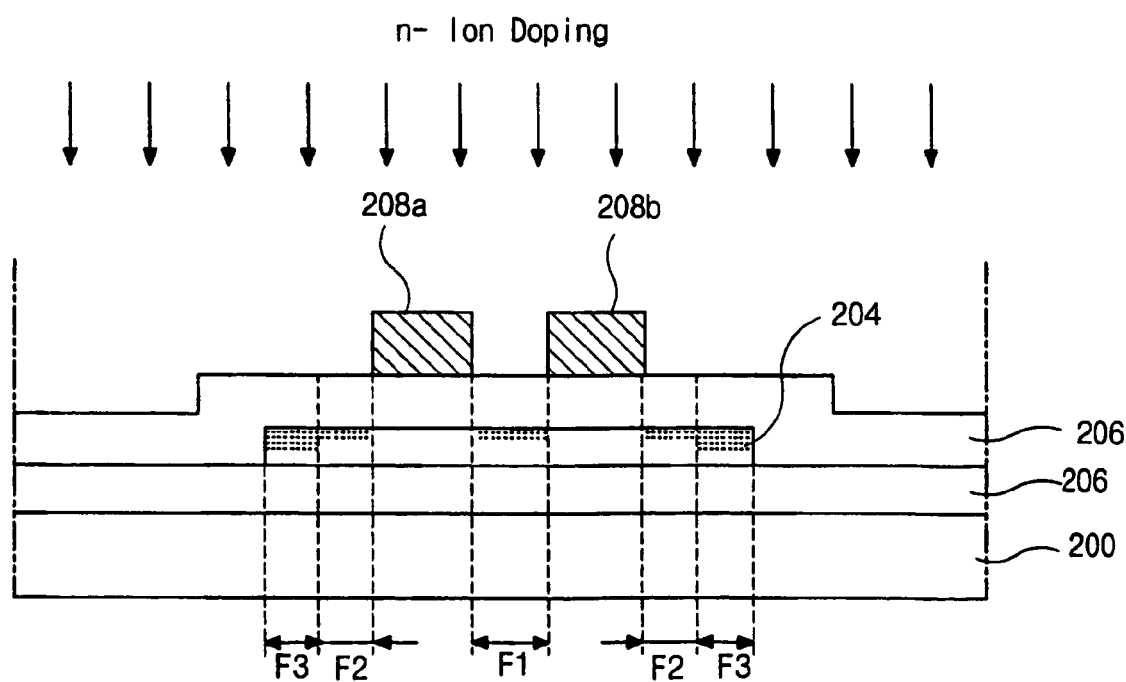

FIGS. 11A and 11B are cross-sectional views of another exemplary polycrystalline silicon thin film according to the present invention. In FIG. 11A, a buffer layer 202 may be formed on a substrate 200, and an island-shaped active layer 204 may be formed on the buffer layer 202. A gate insulation layer 206 may be formed on the buffer layer 202 covering the active layer 204, and first and second gate electrodes 208a and 208b may be formed on the gate insulation layer 206 over the active layer 204. In addition, a photo resist pattern 210 may be formed on portions of the gate insulation layer 206 directly above the active layer 204 to fully cover the first and second gate electrodes 208a and 208b. In particular, the photo resist pattern 210 may be formed directly above a first active area F1 filling up a space between the first and second gate electrodes 208a and 208b, and directly above a second active area F2.

Moreover, $n^+$ ion doping may be performed on an entire surface of the substrate 200. Accordingly, portions of the active layer 204, which are not shielded by the first and second gate electrodes 208a and 208b and photo resist pattern 210, may be doped by the $n^+$ ions, thereby defining third active areas F3. The first active area F1 between the first and second gate electrodes 208a and 208b and the second areas F2 that are shielded by the photo resist 210 may remain un-doped regions. Moreover, the third active areas F3, which is not overlapped by the photo resist pattern 210 and doped by the $n^+$ ions, may become the highly doped regions (HDRs).

In FIG. 11B, the photo resist pattern 210 (in FIG. 11A) may be removed, and the $n^-$ ions may be introduced into the entire surface of the substrate 200. Accordingly, the first and second active areas F1 and F2 of the active layer 204 may become the lightly doped regions (LDRs), and the third active areas F3 may remain as the highly doped regions (HDRs), such that the third active areas F3 may become the source and drain regions. Thus, the source and drain regions (i.e., the highly doped third active areas F3) may be formed first and then the lightly doped first and second active areas F1 and F2 may be formed between the first and second gate electrodes 208a and 208b and next to the first and second gate electrodes 208a and 208b.

Although the present invention discloses the n-type ions throughout the specification, p-type ions can be utilized instead of the n-type ions.

It will be apparent to those skilled in the art that various modifications and variations can be made in the polycrystalline silicon thin film transistor and the method of fabricating the same of the present invention without departing from the spirit or scope of the invention. Thus, it is intended that the present invention cover the modifications and variations of this invention provided they come within the scope of the appended claims and their equivalents.

The invention claimed is:

1. A method for fabricating a thin film transistor device, comprising the steps of:

forming a buffer layer on a substrate;

forming an island-shaped polycrystalline silicon active layer on the buffer layer to include first, second, and third areas;

forming a gate insulation layer on the buffer layer to cover the island-shaped polycrystalline silicon active layer;

forming a dual-gate electrode on the gate insulation layer to correspond to the first areas of the island-shaped polycrystalline silicon active layer, the dual-gate electrode includes a first gate electrode and a second gate electrode;

forming a photo resist pattern completely covering a portion of the gate insulation layer between the first and second gate electrodes;

removing the photo resist pattern from the gate insulation layer and the first and second gate electrodes;

forming an interlayer insulator on the gate insulation layer to cover the first and second gate electrodes;

forming a gate contact hole to expose a portion of the dual-gate electrode by partially etching the interlayer insulator;

forming source and drain contact holes to penetrate both the interlayer insulator and the gate insulation layer to expose the third areas of the island-shaped polycrystalline silicon active layer; and forming source and drain electrodes and a third gate electrode on the interlayer insulator, wherein the source and drain electrodes contact the third areas of the polycrystalline silicon active layer through the source and drain contact holes, and the third gate electrode contacts the exposed portion of the dual-gate electrode through the gate contact hole.

2. The method according to claim 1, wherein the photo resist pattern partially overlaps portions of the first and second gate electrodes.

3. The method according to claim 1, wherein the photo resist pattern has a T-shape.

4. The method according to claim 1, further comprising a step of introducing one of low-density n-type and p-type ions into an entire surface of the substrate after the step of forming the dual-gate electrode and before the step of forming the photo resist pattern.

5. The method according to claim 4, wherein the step of introducing one of the low-density n-type and p-type ions forms a lightly doped region in the second area disposed between the first and second gate electrodes.

6. The method according to claim 5, wherein the second area is a unique area where only one of the low density n-type and p-type ions is doped.

7. The method according to claim 5, further comprising a step of introducing one of high-density n-type and p-type ions into the entire surface of the substrate after the step of forming the photo resist pattern and before the step of removing the photo resist pattern.

8. The method according to claim 7, wherein the step of introducing one of the high-density n-type and p-type ions forms highly doped regions in the third areas of the polycrystalline silicon active layer.

9. The method according to claim 8, wherein the third areas are unique areas where only one of the high-density n-type and p-type ions is doped.

10. The method according to claim 8, wherein the low-density and high-density n-type ions include phosphorous ions.

11. The method according to claim 10, wherein the third gate electrode overlaps the lightly doped region.

12. The method according to claim 1, further comprising a step of introducing one of high-density n-type and p-type ions into an entire surface of the substrate after the step of forming the photo resist pattern and before the step of removing the photo resist pattern.

13. The method according to claim 12, wherein the step of introducing one of the high-density n-type and p-type ions forms highly doped regions in the third areas of the polycrystalline silicon active layer.

14. The method according to claim 13, wherein the third areas are unique areas where only one of the high-density n-type and p-type ions is doped.

15. The method according to claim 13, further comprising a step of introducing one of low-density n-type and p-type ions into the entire surface of the substrate after the step of removing the photo resist pattern and before the step of forming interlayer insulator.

16. The method according to claim 15, wherein the step of introducing one of the low-density n-type and p-type ions forms a lightly doped region in the second area disposed between the first and second gate electrodes.

17. The method according to claim 16, wherein the second area is a unique area where only one of the low-density n-type and p-type ions is doped.

18. The method according to claim 16, wherein the low-density and high-density n-type ions include phosphorous ions.

19. The method according to claim 18, wherein the third gate electrode overlaps the lightly doped region.

20. The method according to claim 1, wherein the first areas corresponding to the dual-gate electrode form channel regions.

21. The method according to claim 1, wherein the third gate electrode includes a same material as the source and drain electrodes.

22. The method according to claim 1, wherein the first, second, and third gate electrodes electrically communicate with a common gate line and receive a same signal voltage from the common gate line.

23. The method according to claim 1, wherein the dual-gate electrode has a U-shape with a first branch that includes the first gate electrode and a second branch that includes the second gate electrode.

24. The method according to claim 1, wherein a distance between the first and second gate electrodes is within a range of about 0.5 to 5 micrometers.

25. The method according to claim 1, wherein the buffer layer, the gate insulation layer, and the interlayer insulator include silicon-based insulating materials.

26. The method according to claim 25, wherein the silicon-based insulating materials include one of silicon oxide and silicon nitride.

27. A method for fabricating a thin film transistor device, comprising the steps of:

forming a buffer layer on a substrate;

forming an island-shaped polycrystalline silicon active layer on the buffer layer to include first, second, and third areas;

forming a gate insulation layer on the buffer layer to cover the island-shaped polycrystalline silicon active layer;

forming a dual-gate electrode on the gate insulation layer to correspond with the first areas, the dual-gate electrode includes a first gate electrode and a second gate electrode;

forming a photo resist pattern on a portion of the gate insulation layer between the first and second gate electrodes to fully cover the first and second gate electrodes, fill a space between the first and second gate electrodes, and partially overlap the third areas;

removing the photo resist pattern from the gate insulation layer and the first and second gate electrodes;

forming an interlayer insulator on the gate insulation layer to cover the first and second gate electrodes;

forming gate contact holes to expose a portion of the dual-gate electrode by partially etching the interlayer insulator;

forming source and drain contact holes to penetrate both the interlayer insulator and the gate insulation layer to expose the third areas; and forming source and drain electrodes and a third gate electrode on the interlayer insulator, wherein the source and drain electrodes contact the third areas of the polycrystalline silicon active layer through the source and drain contact holes, and the third gate electrode contacts the exposed portion of the dual-gate electrode through the gate contact hole.

28. The method according to claim 27, further comprising a step of introducing one of low-density n-type and p-type ions into an entire surface of the substrate after the step of forming the dual-gate electrode and before the step of forming the photo resist pattern.

29. The method according to claim 28, wherein the step of introducing one of the low-density n-type and p-type ions forms lightly doped regions in the second area disposed between the first and second gate electrodes and in the third areas along outer parts of the polycrystalline silicon active layer not shielded by the first and second gate electrodes.

30. The method according to claim 29, further comprising a step of introducing one of high-density n-type and p-type ions into the entire surface of the substrate after the step of forming the photo resist pattern and before the step of removing the photo resist pattern.

31. The method according to claim 30, wherein the step of introducing one of the high-density n-type and p-type ions forms highly doped regions in portions of the third areas which are not overlapped by the photo resist pattern.

32. The method according to claim 31, wherein the low-density and high-density n-type ions include phosphorous ions.

33. The method according to claim 32, wherein the third gate electrode overlaps the lightly doped regions.

34. The method according to claim 27, further comprising a step of introducing one of high-density n-type and p-type ions into an entire surface of the substrate after the step of forming the photo resist pattern and before the step of removing the photo resist pattern.

35. The method according to claim 34, wherein the step of introducing one of the high-density n-type and p-type ions forms highly doped regions in portions of the third areas which are not overlapped by the photo resist pattern.

36. The method according to claim 35, further comprising a step of introducing one of low-density n-type and p-type ions into the entire surface of the substrate after the step of removing the photo resist pattern and before the step of forming interlayer insulator.

37. The method according to claim 36, wherein the step of introducing one of the low-density n-type and p-type ions forms lightly doped regions in the second area disposed between the first and second gate electrodes and in the third areas along outer parts of the polycrystalline silicon active layer not shielded by the first and second gate electrodes.

38. The method according to claim 37, wherein the low-density and high-density n-type ions include phosphorous ions.

39. The method according to claim 38, wherein the third gate electrode overlaps the lightly doped regions.

40. The method according to claim 27, wherein the first areas corresponding to the dual-gate electrode form channel regions.

41. The method according to claim 27, wherein the third gate electrode includes a same material as the source and drain electrodes.

42. The method according to claim 27, wherein the first, second, and third gate electrodes electrically communicate with a common gate line and receive a same signal voltage from the common gate line.

43. The method according to claim 27, wherein the dual-gate electrode has a U-shape with a first branch that includes the first gate electrode and a second branch that includes the second gate electrode.

44. The method according to claim 27, wherein a distance between the first and second gate electrodes is within a range of about 0.5 to 5 micrometers.

45. The method according to claim 27, wherein the buffer layer, the gate insulation layer, and the interlayer insulator include silicon-based insulating materials.

46. The method according to claim 45, wherein the silicon-based insulating materials include one of silicon oxide and silicon nitride.

* * * * *